(12) United States Patent
Brown et al.

(10) Patent No.: US 6,187,670 B1
(45) Date of Patent: Feb. 13, 2001

(54) MULTI-STAGE METHOD FOR FORMING OPTIMIZED SEMICONDUCTOR SEED LAYERS

(75) Inventors: Dirk Brown, Santa Clara; John A. Iacoponi, San Jose, both of CA (US)

(73) Assignee: Advanced Micro Devices, Inc., Sunnyvale, CA (US)

( * ) Notice: Under 35 U.S.C. 154(b), the term of this patent shall be extended for 0 days.

(21) Appl. No.: 09/204,741

(22) Filed: Dec. 2, 1998

(51) Int. Cl.$^7$ ................................................ H01L 21/4763

(52) U.S. Cl. .................... 438/638; 438/687; 438/688; 438/685

(58) Field of Search ..................................... 438/688, 687, 438/685, 680, 681, 638, 640, 701, 686

(56) References Cited

U.S. PATENT DOCUMENTS

| | | | |
|---|---|---|---|
| 5,523,259 | * | 6/1996 | Merchant et al. ................... 438/688 |
| 5,981,382 | * | 11/1999 | Konecni et al. ..................... 438/646 |
| 6,037,258 | * | 3/2000 | Liu et al. .............................. 438/687 |

* cited by examiner

*Primary Examiner*—Caridad Everhart
(74) *Attorney, Agent, or Firm*—Mikio Ishimaru

(57) ABSTRACT

A method is provided for forming seed layers in semiconductor channel and via openings by using a two-stage approach after lining the channel and via openings with barrier material. First, a low temperature deposition of a seed layer is performed at below the 250° C. at which conductive material agglomeration occurs. Second, a higher temperature deposition of a seed layer is performed at above 250° C. Then, the conductive material is deposited to fill the channel and via openings.

10 Claims, 3 Drawing Sheets

MULTI-STAGE METHOD FOR FORMING OPTIMIZED SEMICONDUCTOR SEED LAYERS

TECHNICAL FIELD

The present invention relates generally to semiconductors and more specifically to seed materials used in semiconductor processing.

BACKGROUND ART

In the process of manufacturing integrated circuits, after the individual devices, such as the transistors, have been fabricated in the silicon substrate, they must be connected together to perform the desired circuit functions. This connection process is generally called "metalization", and is performed using a number of different photolithographic and deposition techniques.

One metalization process, which is called the "damascene" technique starts with the placement of a first channel dielectric layer, which is typically an oxide layer, over the semiconductor devices. A first damascene step photoresist is then placed over the oxide layer and is photolithographically processed to form the pattern of the first channels. An anisotropic oxide etch is then used to etch out the channel oxide layer to form the first channel openings. The damascene step photoresist is stripped and a barrier layer is deposited to coat the walls of the first channel opening to ensure good adhesion and to act as a barrier material to prevent diffusion of such conductive material into the oxide layer and the semiconductor devices (the combination of the adhesion and barrier material is collectively referred to as "barrier layer" herein). A seed layer is then deposited on the barrier layer to form a conductive material base, or "seed", for subsequent deposition of conductive material. A conductive material is then deposited in the first channel openings and subjected to a chemical-mechanical polishing process which removes the first conductive material above the first channel oxide layer and damascenes the conductive material in the first channel openings to form the first channels.

For multiple layers of channels, another metalization process, which is called the "dual damascene" technique, is used in which the channels and vias are formed at the same time. In one example, the via formation step of the dual damascene technique starts with the deposition of a thin stop nitride over the first channels and the first channel oxide layer. Subsequently, a separating oxide layer is deposited on the stop nitride. This is followed by deposition of a thin via nitride. Then a via step photoresist is used in a photolithographic process to designate round via areas over the first channels.

A nitride etch is then used to etch out the round via areas in the via nitride. The via step photoresist is then removed, or stripped. A second channel dielectric layer, which is typically an oxide layer, is then deposited over the via nitride and the exposed oxide in the via area of the via nitride. A second damascene step photoresist is placed over the second channel oxide layer and is photolithographically processed to form the pattern of the second channels. An anisotropic oxide etch is then used to etch the second channel oxide layer to form the second channel openings and, during the same etching process to etch the via areas down to the thin stop nitride layer above the first channels to form the via openings. The damascene photoresist is then removed, and a nitride etch process removes the nitride above the first channels in the via areas. A barrier layer is then deposited to coat the via openings and the second channel openings.

Next, a seed layer is deposited on the barrier layer. This is followed by a deposition of the conductive material in the second channel openings and the via openings to form the second channel and the via. A second chemical-mechanical polishing process leaves the two vertically separated, horizontally perpendicular channels connected by a cylindrical via.

The use of the damascene techniques eliminates metal etch and dielectric gap fill steps typically used in the metalization process. The elimination of metal etch steps is important as the semiconductor industry moves from aluminum to other metalization materials, such as copper, which are very difficult to etch.

One drawback of using copper is that copper diffuses rapidly through various materials. Unlike aluminum, copper also diffuses through dielectrics, such as oxide. When copper diffuses through dielectrics, it can cause damage to neighboring devices on the semiconductor substrate. To prevent diffusion, materials such as tantalum nitride (TaN), or titanium nitride (TiN) are used as barrier materials for copper. A thin adhesion layer formed of an adhesion material, such as tantalum (Ta) or titanium (Ti), is first deposited on the dielectric layer to ensure good adhesion and good electrical contact to underlying doped regions and/or conductive copper channels. A barrier layer formed of additional Ta or Ti, or TaN or TiN is used as the barrier material.

Seed layers for copper interconnect in a damascene process are traditionally deposited by sputter deposition. A problem associated with this deposition and other relatively high temperature techniques is that agglomeration often occurs over a range of temperatures from 150° C. and above, and definitely above 250° C. for "standard" seed thicknesses of above 5 nm. Agglomeration is a phenomenon in which the seed material forms low energy islands, or masses, instead of spreading out over the barrier layer. These islands cause poor sidewall step coverage and conformality, i.e., the seed layer thickness is not uniform where the agglomeration occurs. For current technology, to guarantee a minimum seed layer thickness of 5 nm anywhere in the channel or via openings as required by current technology, the seed layer is deposited to a thickness much higher than 5 nm. As the width of the channels and vias have decreased in size due to the size reduction in the semiconductor devices, an excessively thick seed layer in the wide-open areas interferes with the subsequent filling of the channel and via openings with conductive materials.

A solution, which would eliminate agglomeration during seed layer deposition and permit smooth filling of the channel or via openings by conductive materials, has long been sought, but has eluded those skilled in the art. As the semiconductor industry is moving from aluminum to copper and other type of materials which permit smaller channels and vias, it is becoming more pressing that a solution be found.

DISCLOSURE OF THE INVENTION

The present invention provides a method for forming seed layers in channel or via openings by using a two-stage approach. First, a low temperature deposition of a seed layer is performed at below the temperatures at which agglomeration occurs. This means below 250° C. for standard thicknesses, below 150° C. for other thicknesses, and preferably below 100° C. The absence of agglomeration results in a first seed layer with good adhesion and uniform thickness. Second, a deposition of the seed layer is performed at above 250° C. At the higher temperatures, the seed material has improved flow and surface mobility which results in better sidewall coverage and enhanced subsequent filling of the channel and via openings by conductive material.

The present invention further provides a method for forming a first seed layer in channel or via openings by using sputter deposition at temperatures below 100° C. to form a seed layer which is not subject to agglomeration. A subsequent deposition of a second seed layer is performed by using sputter deposition at above 250° C. to improve the seed layer sidewall step coverage and enhance the subsequent filling of the channel and via openings by conductive materials.

The present invention still further provides a two-temperature method for forming seed layers in channel or via openings with improved step coverage and conformality.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
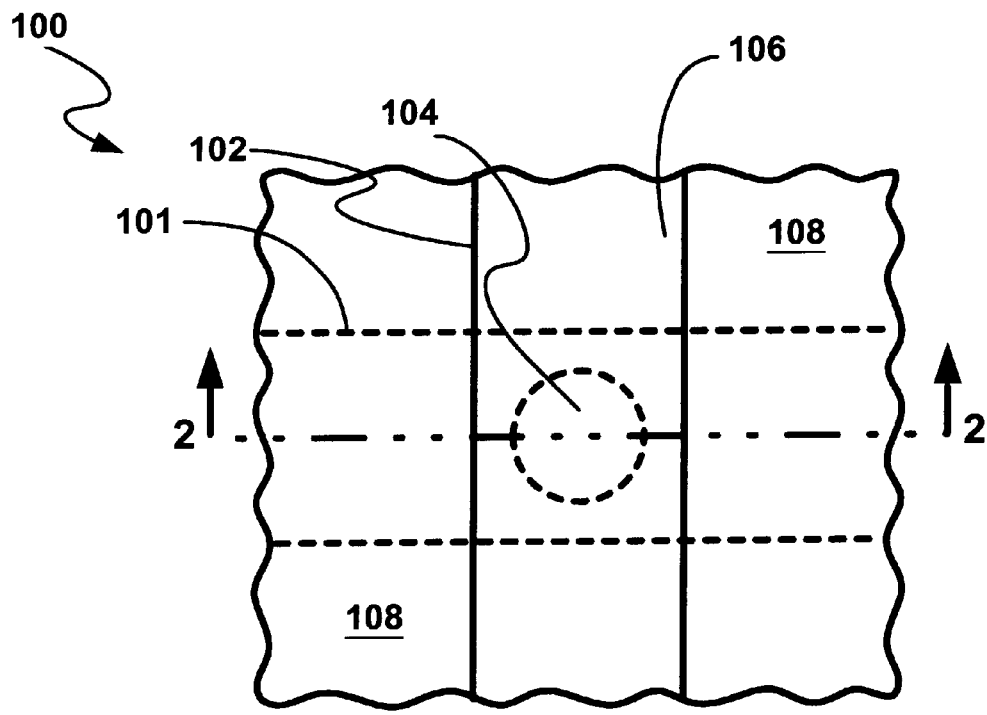
FIG. 1A (PRIOR ART) is a plan view of aligned channels with a prior art via.

Referring now to FIG. 1A (PRIOR ART), therein is shown a plan view of a prior art pair of aligned semiconductor channels of a conductive material such as aluminum, copper, tungsten or polysilicon disposed over a production semiconductor wafer 100. A first channel 101 is shown disposed below a second channel 102 which extends substantially perpendicular to the first channel 101 in the plan view. Similarly, a round via 104 connects the first and second channels 101 and 102 and is a part of the second channel 102. The first channel comprises a first conductive material. The second channel 102 is formed by filling a second channel opening 106 disposed in a second channel oxide layer 108 with a second conductive material. The second channel opening 106 is defined by walls (sidewalls) 109 of second oxide layer 108.

Figure 1B:
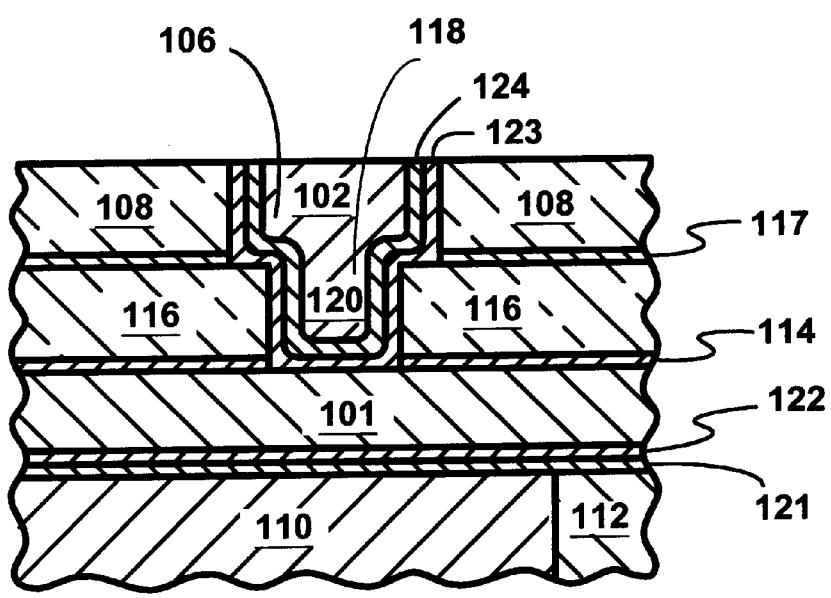
FIG. 1B (PRIOR ART) is a cross-section of FIG. 1A (PRIOR ART) along line 2—2.

Referring now to FIG. 1B (PRIOR ART), therein is shown a cross-section of FIG. 1A (PRIOR ART) along 2—2. The first channel 101 is disposed over a polysilicon gate 110 and a dielectric 112 of a semiconductor device on an integrated circuit chip (not shown). The first and second channels 101 and 102 are in horizontal planes separated vertically by a stop nitride layer 114, a via oxide layer 116, and a thin via nitride layer 117. The cross-sectional area of the round via 104 of FIG. 1A (PRIOR ART) defines a cylindrical via 120 when it is filled with the second conductive material.

Also shown disposed around the first channel 101 are a barrier layer 121 and a seed layer 122, and around the second channel 102 and the cylindrical via 120 are a barrier layer 123 and seed layer 124. Seed layers 122 and 124 include seed materials, which are generally, copper or copper alloys.

Figure 1C:
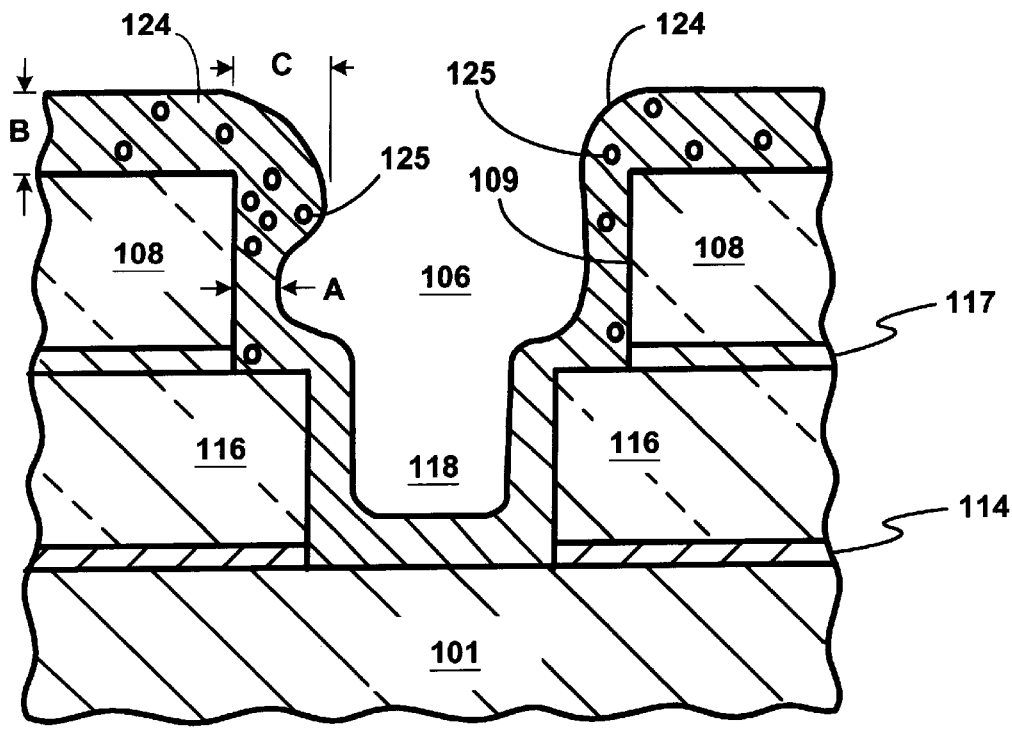
FIG. 1C (PRIOR ART) is a simplified cross-section of FIG. 1A (PRIOR ART) along line 2—2 immediately after the deposition of seed material in the second channel opening.

Referring now to FIG. 1C (PRIOR ART), therein is shown a close-up cross section of the semiconductor wafer 100 along 2—2 after the deposition of the seed layer 124 and prior to the filling of the second channel opening 106 and via opening 118 with the second conductive material. As previously explained, a problem associated with traditional sputter deposition techniques is poor sidewall step coverage and conformality, i.e., the seed layer thickness varies. The sidewall step coverage and conformality are defined as follows:

Sidewall step coverage=A/B

Conformality=A/C where A is the thickness of the thinnest area of the seed layer 124 along the sidewalls 109, B is the thickness of the seed layer 124 on top of the second channel oxide layer 108, and C is the thickness of the thickest area of the seed layer 124 along the sidewalls 109 due to the agglomerates 125. It is desirable to have high values in sidewall step coverage and conformality. In this case, since A is much smaller than either B or C, the sidewall step coverage and conformality would be low, indicating poor sidewall step coverage and conformality.

To guarantee a minimum seed layer thickness of 5 nm anywhere in the channel opening 106, including at the lower portion of the sidewalls 109, the seed layer thickness in the wide-open areas tends to be much higher than 5 nm and in the range of 100 to 200 nm on top of the second channel oxide layer 108. Further, an excessively thick seed layer in the upper portion of the sidewalls of the second channel opening 102 would interfere with the subsequent filling of the second channel opening 106 and via opening 118 with the second conductive material. This has become an increasingly greater problem as the width of the channels and vias have decreased in size due to the size reduction in the semiconductor devices.

Figure 2:
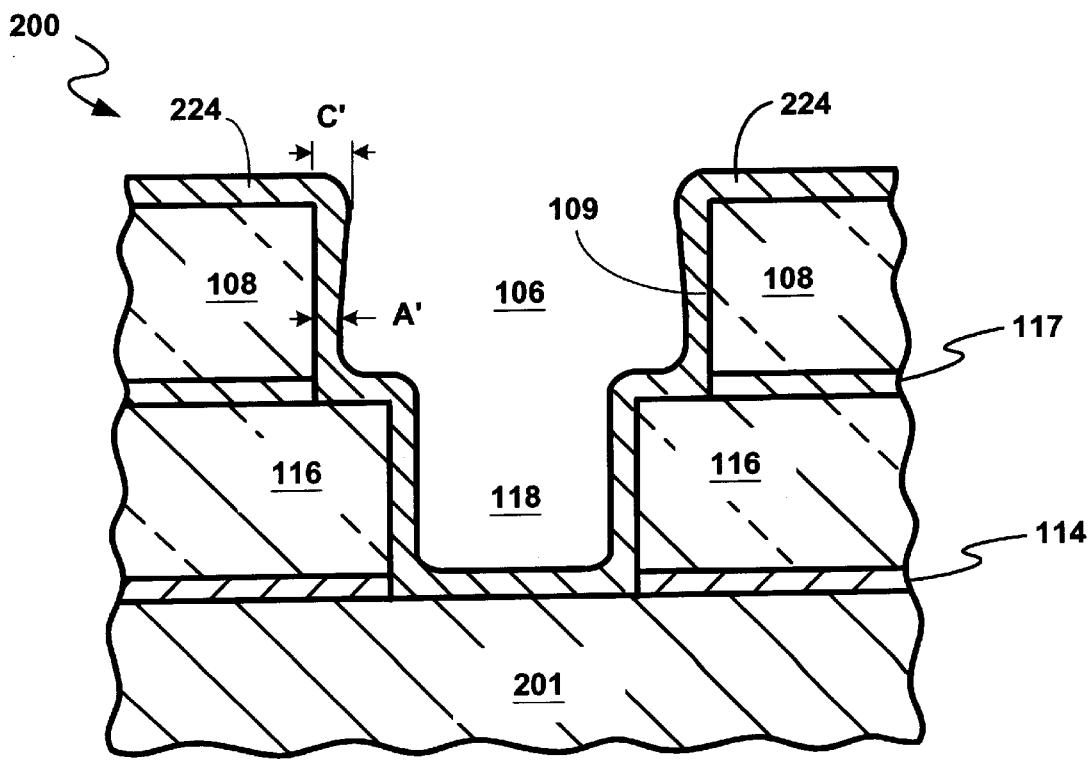
FIG. 2 is a simplified cross-section similar to that taken along line 2—2 of FIG. 1A (PRIOR ART) after the first seed layer deposition.

Referring to FIG. 2, therein is shown the cross-section of a semiconductor wafer 200 from the first channel 201 above with the first channel opening 106 and via opening 118. While all the channels are formed using the same process that will hereinafter be described, the process for the second channel is described for the ease of illustration. For convenience of illustration, like reference numerals are used in FIG. 2 to denote like elements already described in FIG. 1A (PRIOR ART) through FIG. 1C (PRIOR ART). Similarly, for purposes of clarity, the barrier layer 122 is not shown.

At this stage a thin, first seed layer 224 is shown formed to line the second channel opening 106 and the via opening 118 by a deposition process, preferably a sputter deposition. It is performed at temperatures below 250° C. for standard thickness of about 5 nm at which agglomeration generally occurs and below 150° C. where agglomeration occurs in thinner films, and preferably below 100° C. to have a margin of safety. The deposition can also be performed from 50° C. down to room temperature. The thickness of the first seed layer 224 is determined by the thickness of the second seed layer which will hereinafter be described, but the combined thickness will be about 5 nm.

Without the agglomerates, the conformality (A'/C') will have increased.

Figure 3:
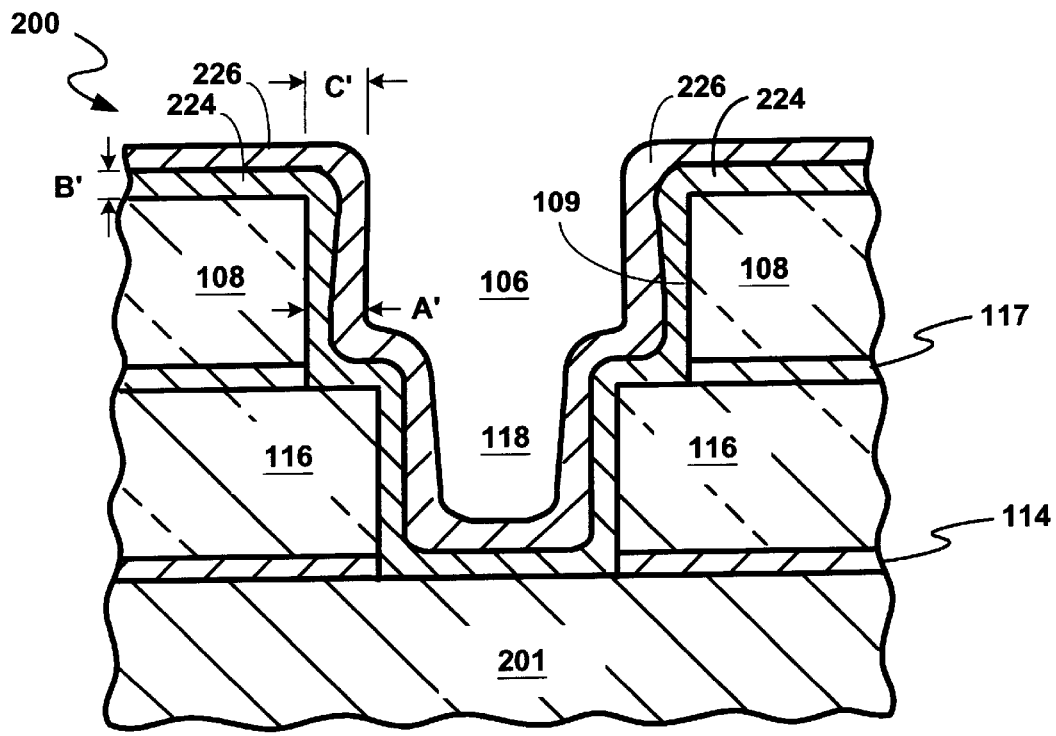
FIG. 3 is the cross-section of FIG. 2 after the second seed layer deposition.

Referring now to FIG. 3, therein is shown the cross-section of FIG. 2 after the deposition of a thin, second seed layer 226 on top of the first seed layer 224. For convenience of illustration, like reference numerals are used in FIG. 3 to denote like elements already described in FIG. 2.

The second seed layer 226 is shown formed in the second channel opening 106 by a deposition process, preferably a sputter deposition, performed at temperatures above 250° C. The process would generally be a continuation of the deposition process of the first seed layer but performed at the higher temperature. This higher temperature deposition allows for better flow and surface mobility of the seed material which allows for better sidewall coverage and a more rounded profile of the bottom and via edges, as shown in FIG. 3. The thickness of the second seed layer 226 is determined by the thickness desired to obtain the desired uniform sidewall coverage and rounded profile, and to assure that the combined thickness will be the minimum thickness required to carry sufficient current for the copper plating process which fills the opening.

Due to the greater surface mobility of the seed material at higher temperatures, the combined thicknesses of the first and second seed layers 224 and 226 on top of the second channel oxide layer 108 (B') and the combined thicknesses of the thinnest areas of the combine first and second seed layers 224 and 226 along the sidewalls 109 (A') will be about the same. Accordingly, the sidewall step coverage (A'/B') has substantially increased.

Figure 4:
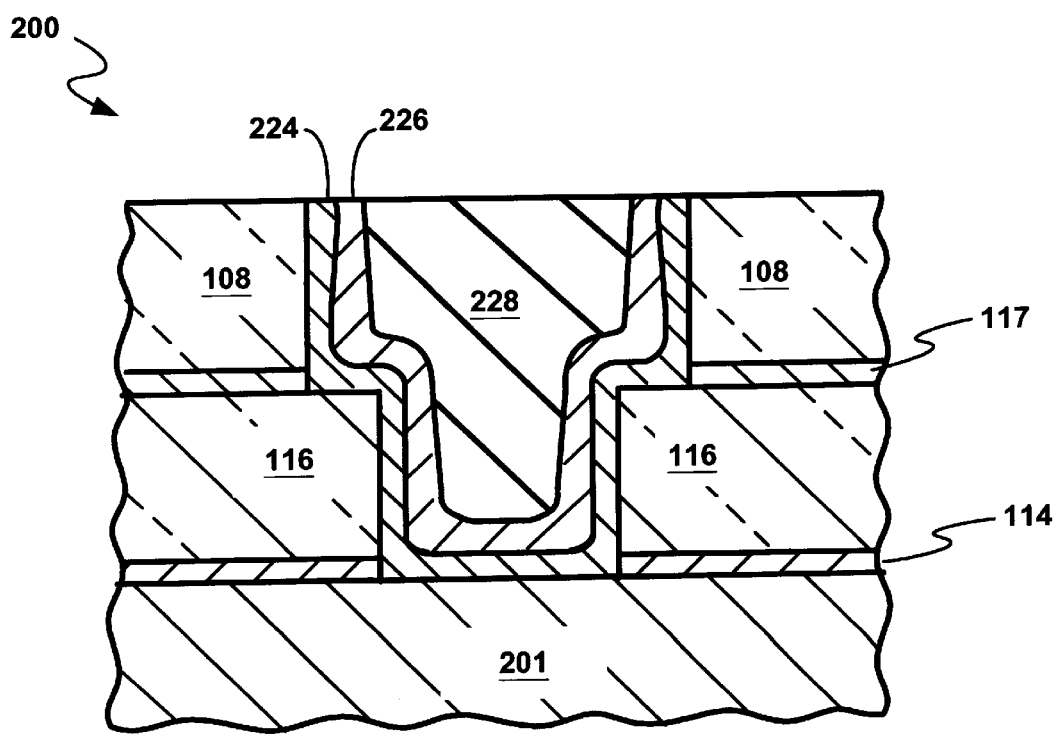
FIG. 4 is the cross-section of FIG. 3 after the conductive layer is deposited and the semiconductor wafer is polished.

Referring now to FIG. 4, therein is shown the cross-section of FIG. 4 after deposition of a conductive material 228 in the channel 106 and the via opening 118. The conductive material, the seed materials, and the barrier material outside the channel 106 and above the channel oxide layer 108 are removed by a conventional removal process such as chemical-mechanical polishing.

In production, a conventional first damascene process is used to put down a first channel 201 in a first channel oxide layer above portions of a semiconductor device over a production semiconductor wafer 200. The damascene process is a photolithographic process which uses a mask to define a first channel opening in the first channel oxide layer. The first channel opening is then lined with the barrier layer 121 and a seed layer (not shown), as will be hereinafter described. The seed layer is then filled with a conductive material, such as copper, to form the first channel 201 using conventional metal deposition techniques, such as electroplating, physical vapor deposition, chemical vapor deposition, or a combination thereof. The stop nitride layer 114, the via oxide layer 116, and the via nitride layer 117 would be successively deposited on top of the first channel 201 and the first channel oxide layer using conventional deposition techniques.

By using the via photoresist and the via photolithographic process followed by nitride etching of a round via opening 104 in the via nitride layer 117, the basis for the cylindrical via 118 was formed. The subsequent deposition of the second channel oxide layer 108 prepared the way for the second channel 106 to be perpendicular to the first channel 201.

The second damascene process is a photolithographic process which uses a mask to define the second channel opening 106 in the second channel oxide layer 108. Since the second damascene process uses an anisotropic oxide etch, the etch also forms the cylindrical via opening 118 down to the stop nitride layer 114. The anisotropic oxide etch etches faster in the vertical direction of FIG. 2 than in the horizontal direction. The nitride etch of the stop nitride layer 114 exposes a portion of the first channel 201 and completes the etching steps.

Next, the barrier layer 123 is deposited in and lines the walls of the second channel opening 106 and the cylindrical via opening 118. Examples of suitable barrier materials include refractory metals such as titanium, tantalum, tungsten, compounds thereof (especially the nitrides), alloys thereof, and combinations thereof. The barrier layer 123 is deposited using deposition techniques, such as physical vapor deposition, chemical vapor deposition, or a combination thereof.

Thereafter, the thin, first seed layer 224 is deposited on and lines the barrier layer 123 in the second channel opening 106 and the cylindrical via opening 118. Again, the thickness of the seed layer 224 is insufficient to fill the second channel opening 106 and the cylindrical via opening 118. The seed layer 224 is deposited using the lower temperature sputter deposition technique below 250° C. for standard thicknesses, below 150° C. for thinner thicknesses, and preferably below 100° C.

Thereafter, the thin, second seed layer 226 is deposited on and lines the first seed layer 224 in the second channel opening 106 and the cylindrical via opening 118. Again, the thickness of the second seed layer 22 is insufficient to fill the second channel opening 106 and the cylindrical via opening 118. The seed layer 224 is deposited using the higher temperature sputter deposition technique at or above 250° C.

It should be understood that the present invention contemplates obtaining the same result by varying the deposition temperature starting at well below 250° C. and ending well above 250° C. in a continuous deposition process which would provide a gradated seed layer.

Next, the second conductive material is deposited into second channel opening 106 and via opening 118 using conventional metal deposition techniques, such as physical vapor deposition, chemical vapor deposition, electroplating, or a combination thereof. Thereafter, a chemical-mechanical polishing process is used to complete the conventional connection process.

Accordingly, by using a two-temperature deposition of the seed layer, the present invention forms seed layers in channel openings or via openings with improved sidewall step coverage and enhanced proper filling of the channel openings and via openings by conductive materials.

It should be understood that the present invention is applicable to conductive and seed materials such as copper, aluminum, tungsten, doped polysilicon, gold, silver, their compounds, their alloys, and combinations thereof.

Further, although the embodiments of the present invention are directed to using the dual damascene technique, it also will be recognized by those skilled in the art that other techniques of forming interconnect, such as the single damascene technique, or other traditional techniques of forming low resistance contacts or plugs which involve filling an opening with conductive materials such as tungsten or aluminum may be used to practice the present invention. In addition, while the embodiments of the present inventions form a seed layer in a channel opening and a via opening atop another conductive channel, it should be understood that the present invention is applicable to forming a seed layer in a channel opening and/or a via opening atop a conductive or a doped region formed on a semiconductor substrate.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

The invention claimed is:

1. A method of manufacturing a semiconductor device, comprising the steps of:
   providing a semiconductor substrate with a dielectric layer formed thereon, wherein said dielectric layer overlays a region on said semiconductor substrate;
   forming an opening in said dielectric layer, said opening defined by walls of said dielectric layer and exposes a portion of said region on said semiconductor substrate;
   forming a barrier layer on said dielectric layer and in said opening, including along said walls, in contact with said region of said semiconductor substrate, said barrier layer formed to a thickness insufficient to fill said opening, wherein said step of forming said barrier layer is performed by a process selected from a group comprising physical vapor deposition, chemical vapor deposition, and a combination thereof;
   forming a first seed layer in contact with said barrier layer, said seed layer formed to a thickness insufficient to fill said opening, wherein said step of forming said seed layer is performed by a deposition process at first temperature, wherein said step of forming said first seed layer by said first temperature deposition increases conformality of said first seed layer, conformality is defined to be A/C, where A is the thickness of the thinnest area of said seed layer along said walls and C is the thickness of the thickest area of said seed layer along said walls;
   forming a second seed layer in contact with said first seed layer, said second seed layer formed to a thickness insufficient to fill said opening, wherein said step of forming said second seed layer is performed by a deposition process at a second temperature above said first temperature, wherein said step of forming said second seed layer by said second temperature deposition increases sidewall step coverage, side wall step coverage is defined to be A/B, where A is the thickness of the thinnest area of said seed layer along said walls and B is the thickness of said seed layer on said dielectric layer;
   forming a conductive layer in contact with said second seed layer, said conductive material layer substantially filling said opening; and
   removing said barrier layer said first and second seed layers, and said conductive layer outside of said opening.

2. The method as claimed in claim 1 wherein said steps of:
   forming said first seed layer is performed by a sputter deposition process at a temperature below 250° C.; and
   forming said second seed layer is performed by a sputter deposition process at a temperature above 250° C.

3. The method as claimed in claim 1 wherein said step of:
   forming said first seed layer is performed by said sputter deposition process below 150° C.; and
   forming said second seed layer is performed by said sputter deposition process above 250° C.

4. The method as claimed in claim 1 wherein said step of:
   forming said first seed layer is performed by said sputter deposition process below 100° C.; and
   forming said second seed layer is performed by said sputter deposition process above 250° C.

5. The method as claimed in claim 1 wherein said step of:
   forming said first seed layer begins below a temperature of 250° C. and increases continuously into forming said second seed layer; and
   forming said second seed layer ends above a temperature of 250° C.

6. The method as claimed in claim 1 wherein said step of:
   forming said first seed layer begins below a temperature of 100° C. and increases rapidly and continuously into forming said second seed layer; and
   forming said second seed layer ends above a temperature of 250° C.

7. The method as claimed in claim 1 wherein said step of forming said barrier layer is performed with a material selected from a group comprising tantalum, titanium, tungsten, a nitride thereof, an alloy thereof, and a combination thereof.

8. The method as claimed in claim 1 wherein said step of forming said seed layer is performed with a material selected from a group comprising copper, aluminum, gold silver, a compound thereof, an alloy thereof, and a combination thereof.

9. A method of manufacturing a semiconductor device, comprising the steps of:
   providing a semiconductor substrate with a dielectric layer formed thereon, wherein said dielectric layer overlays a region on said semiconductor substrate;
   forming an opening in said dielectric layer, said opening defined by walls of said dielectric layer and exposes a portion of said region on said semiconductor substrate;
   forming a barrier layer comprising a material selected from the group consisting of titanium and tantalum on said dielectric layer and in said opening, including along said walls, in contact with said region of said semiconductor substrate, said barrier layer formed to a thickness insufficient to fill said opening, wherein said step of forming said adhesion layer is performed by a process selected from a group comprising physical vapor deposition, chemical vapor deposition, and a combination thereof;
   forming a seed layer comprising a material selected from the group consisting of copper, gold, silver, a compound thereof, and a combination thereof in contact with said barrier layer, said seed layer formed to a thickness insufficient to fill said opening, wherein said step of forming said seed layer is performed by sputter deposition around and below 100° C. to prevent agglomeration and to reduce its thickness at least on top of said dielectric layer and around an upper portion of said walls, wherein said step of forming said seed layer increases sidewall step coverage and conformality of said seed layer, sidewall step coverage is defined to be A/B and conformality is defined to be A/C, where A is the thickness of the thinnest area of said seed layer along said walls, B is the thickness of said seed layer on said dielectric layer, and C is the thickness of the thickest area of said seed layer along said walls; and
   forming a conductive layer in contact with said seed layer, wherein said conductive material is selected from a group comprising aluminum, tungsten, copper, gold, silver, and a combination thereof said conductive material layer substantially fills said opening, and the step of forming said layer of conductive material is performed by a process selected from a group comprising physical vapor deposition, chemical vapor deposition, electroplating, and a combination thereof.

10. The method as claimed in claim 9 wherein said step of
   forming said seed layer is performed in part by said sputter deposition process above 250° C.

* * * * *